(12) United States Patent
Freidhof

(10) Patent No.: US 11,609,246 B2
(45) Date of Patent: Mar. 21, 2023

(54) TEST AND MEASUREMENT DEVICE AS WELL AS METHOD FOR APPLYING A TRIGGER

(71) Applicant: Rohde & Schwarz GmbH & Co. KG, Munich (DE)

(72) Inventor: Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/599,136

(22) Filed: May 18, 2017

(65) Prior Publication Data

US 2018/0335451 A1 Nov. 22, 2018

(51) Int. Cl.
*G01R 13/02* (2006.01)

(52) U.S. Cl.
CPC ............................... *G01R 13/0254* (2013.01)

(58) Field of Classification Search
CPC .................................................. G01R 13/0254
See application file for complete search history.

(56) References Cited

U.S. PATENT DOCUMENTS

| 9,410,989 B2 | 8/2016 | Weller | |
|---|---|---|---|
| 2013/0195249 A1* | 8/2013 | Edler | A61B 6/54 378/91 |
| 2017/0059618 A1* | 3/2017 | Lee | G01R 13/0254 |
| 2017/0227581 A1* | 8/2017 | Knierim | G01R 13/0254 |

* cited by examiner

*Primary Examiner* — Brigitte A Paterson
(74) *Attorney, Agent, or Firm* — Christensen O'Connor Johnson Kindness PLLC

(57) ABSTRACT

A test and measurement device is described with at least one measurement channel, a measurement input, an analog to digital converter, and an acquisition unit. The test and measurement device has a trigger clock configured to generate repeated trigger clock timings, the trigger clock timings controlling the acquisition unit. In addition, a method for applying a trigger is described.

16 Claims, 1 Drawing Sheet

TEST AND MEASUREMENT DEVICE AS WELL AS METHOD FOR APPLYING A TRIGGER

FIELD OF THE DISCLOSURE

Embodiments of the present disclosure relate generally to a test and measurement device as well as a method for applying a trigger.

BACKGROUND

In the state of the art, test and measurement devices are known that comprise a trigger that is used to trigger on a signal in order to identify a time dependency of a measuring signal with respect to the signal that is triggered. Accordingly, the measuring signal is triggered on the signal being a so called trigger signal. For instance, this technique is used by test and measurement devices having a line trigger that is used to trigger on the supply frequency, for instance 50 Hz. By applying this trigger, it is easily recognizable if interference between the measuring signal and the supply current occurs as the measuring signal is constant provided that the interference is caused by the supply frequency.

Further, test and measurement systems are known that comprise an external signal generator that generates a signal to be triggered on wherein the signal generated is inputted into the test and measurement device via one of several input channels. However, one of the several input channels is occupied due to triggering purposes which impairs the versatility of the test and measurement device.

To overcome the occupancy of one of the several input channels for triggering purposes, U.S. Pat. No. 9,410,989 B2 describes a test and measurement device that has an internal signal generator. The signal generator generates a trigger signal used for acquisition. For instance, a rectangular signal is generated being used as trigger signal. However, it is required that the signal generator is connected to the clock of the oscilloscope via a signal line such that the trigger signal generated can be forwarded. Thus, the number of internal signal lines is increased.

SUMMARY

Accordingly, there is a need for a simple test and measurement device as well as a method to apply a trigger on a measuring signal without reducing the versatility of the test and measurement device.

To address this need, among others, the present disclosure provides examples of a test and measurement device with at least one measurement channel, a measurement input, an analog-to-digital converter, and an acquisition unit, the test and measurement device further having a trigger clock configured to generate repeated trigger clock timings, the trigger clock timings controlling the acquisition unit.

Further, the present disclosure provides a method for applying a trigger, comprising the following steps:

Setting a trigger clock;

Generating repeated trigger clock timings based on the setting; and

Controlling an acquisition unit with the repeated trigger clock timings.

Accordingly, an internal trigger clock is used to generate a non-continuous trigger function which controls the acquisition unit. The repeated trigger clock timings are singular events which distinguish from a trigger signal being continuously. Typically, a continuous trigger signal such as a rectangular signal or a sinusoidal signal is generated by an internal signal generator. In contrast thereto, the repeated trigger clock timings generated are singular points that control the acquisition unit appropriately. Thus, no signal line between the signal generator and a clock of the test and measurement device is necessary.

For instance, the measurement channel comprises the measurement input, the analog-to-digital converter, and the acquisition unit. If several measurement channels are provided, each of them has a measurement input, an analog-to-digital converter, and an own acquisition unit.

The test and measurement device may comprise an internal signal generator. However, the signal generator does not provide any trigger signal such that no signal line is required between the clock and the signal generator for triggering purposes.

Nevertheless, the internal signal generator can be used as a controller of the trigger clock such that the repeated trigger clock timings are output upon control of the internal signal generator. However, a signal line is not required between the clock and the internal signal generator.

Alternatively, a separately formed signal generator may be used as a controller of the trigger clock wherein the separately formed signal generator is connected to the test and measurement device. For instance, starting of the separately formed signal generator is triggered such that the phasing of the signals generated is reproducible.

According to an aspect, the repeated trigger clock timings are established by a logic level, for instance 2-level logic. Thus, several individual events are used in order to trigger the acquisition unit instead of a continuous signal such as a trigger signal. A binary logic can be used that corresponds to a binary 1 and 0 respectively. Accordingly, no analog signals are used for triggering the acquisition unit.

The trigger clock timings may be digital trigger clock timings.

Due to the singularity of the digital trigger clock timings, the trigger clock timings may substantially correspond to Dirac impulses.

In other words, the repeated trigger clock timings are discrete in contrast to an analog signal, in particular an analog pulsed signal.

According to another aspect, the acquisition unit comprises an acquisition memory. The acquisition memory typically stores data processed by an acquisition trigger located upstream of the acquisition memory. The acquisition trigger may be part of the acquisition unit as well. Accordingly, the acquisition memory stores sampled data that relates to the signal inputted to the test and measurement device.

According to an embodiment, the trigger clock timings control the acquisition memory such that a post-processing of an acquired signal is controlled by the repeated trigger clock timings. Therefore, the already processed and stored sampled data, in particular its post-processing, is controlled by the trigger clock timings. The trigger clock timings may not trigger an acquisition directly, but its post-processing, for instance providing the sampled data for visualization purposes.

According to another embodiment, the acquisition unit is controlled such that measurement values are acquired, the measurement values corresponding to a signal fed to the measurement input of the measurement channel. The trigger clock timings may control the acquisition of measurement values appropriately. For instance, the readiness of the acquisition unit to start an acquisition may be controlled. This means that the acquisition unit is triggered by the repeated trigger clock timings such that the acquisition unit is configured to start an acquisition provided that the trigger condition is met.

According to a certain embodiment, the repeated trigger clock timings are equally spaced. Thus, it is ensured that the acquisition of a measuring signal can be performed in a regular, in particular periodical, manner as the repeated trigger clock timings trigger the readiness of the acquisition unit.

In one embodiment, the repeated trigger clock timings are periodically. A periodic start of the acquisition is ensured due to the periodic trigger clock timings.

Furthermore, the repeated trigger clock timings may be spaced according to a predetermined sequence. This predetermined sequence can be set by a user of the test and measurement device. Furthermore, the predetermined sequence may be stored by a manufacturer of the test and measurement device such that certain sequences are stored for different purposes which can be retrieved appropriately. Even though the predetermined sequences are stored by the manufacturer, the user is enabled to adapt them according to his needs and intentions.

Moreover, the trigger clock may be implemented as a digital counter. Hence, the trigger clock outputs only two different values, namely "0" and "1" corresponding to the binary system. In other words, the trigger clock timings correspond to a switch function having the values "0" ("off") and "1" ("on").

According to another aspect, a delay unit is provided, the delay unit being configured to shift the trigger clock timings by at least one time delay. The delay unit may be applied in order to compensate delays occurring during at least one of the measurement and the processing. The delay unit may be controlled automatically by the test and measurement device. Further, the delay unit may be set by a user of the test and measurement device during the measurements. Moreover, the delay unit may be used for shifting the trigger clock timings in a certain way with regard to the measuring signal, for instance concerning phase information.

In one embodiment, the at least one time delay is between 0 and the time interval between two subsequent trigger clock timings. Accordingly, the trigger clock timings can be shifted in a flexible manner as issuing trigger clock timing can be postponed up to the complete time interval between two subsequent trigger clock timings.

Further, a user interface may be provided, the user interface being connected to set trigger clock, the trigger clock being configured to be set via the user interface. Accordingly, the trigger clock is set by a user via a user interface. The user sets the trigger clock via the user interface before the repeated trigger clock timings are generated. Therefore, it is ensured that the user may set the trigger clock appropriately. For instance, the user may set a certain frequency to be used as the trigger function for triggering the acquisition unit. Depending on the frequency set by the user, the trigger clock outputs trigger clock timings being spaced from each other by the time interval corresponding to the frequency set.

According to another aspect, the test and measurement device is at least one of an oscilloscope and a spectrum analyzer. Typically, oscilloscopes are used for triggering measurements, but spectrum analyzers also may have such a function.

Particularly, the trigger clock timings are singular events. These singular events may occur periodically as the user may set a certain frequency via the user interface for generating digital pulses in time intervals corresponding to the frequency set. These singular events relate to a digital output of the trigger clock.

According to another aspect, an acquisition memory of the acquisition unit is controlled with the repeated trigger clock timings. Thus, the trigger clock controls the acquisition memory, in particular its readiness for acquiring measurement data forwarded through an acquisition trigger, for instance.

According to another embodiment, a post-processing of an acquired signal stored in the acquisition memory is controlled with the repeated trigger clock timings. The post-processing may relate to visualization of the already acquired signal that is stored in the acquisition memory.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
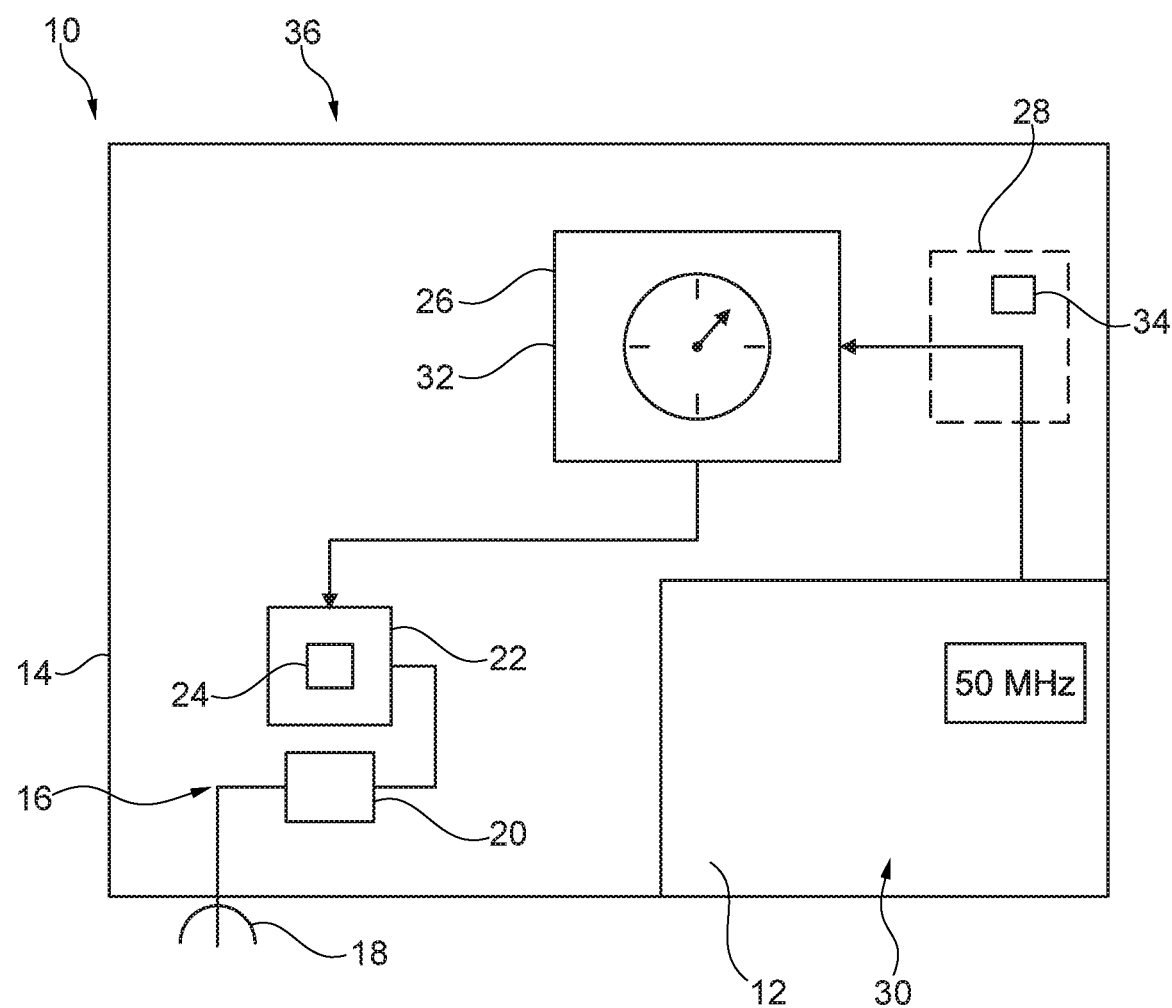
FIG. 1 shows a schematic overview of a test and measurement device according to an embodiment.

In FIG. 1, a test and measurement device 10 is shown that comprises a schematically shown display 12 being encompassed in a housing 14. In the shown embodiment, the test and measurement device 10 has a measurement channel 16 that comprises a measurement input 18, an analog-to-digital converter 20 as well as an acquisition unit 22 that acquires a digital representative of the signal input at the measurement input 18. Accordingly, the analog-to-digital converter 20 is located between the measurement input 18 and the acquisition unit 22.

As shown in FIG. 1, the acquisition unit 22 comprises an acquisition memory 24 that is used to store acquired measurement data that relates to the measuring signal forwarded via the measurement input 18.

Further, the test and measurement device 10 has a trigger clock 26 that is connected with the acquisition unit 22 for controlling purposes. Hence, a unidirectional signal line may be provided for connecting the trigger clock 26 and the acquisition unit 22 with each other. The trigger clock 26 is also connected with a control and processing unit 28 that is connected to the display 12.

Figure 2:
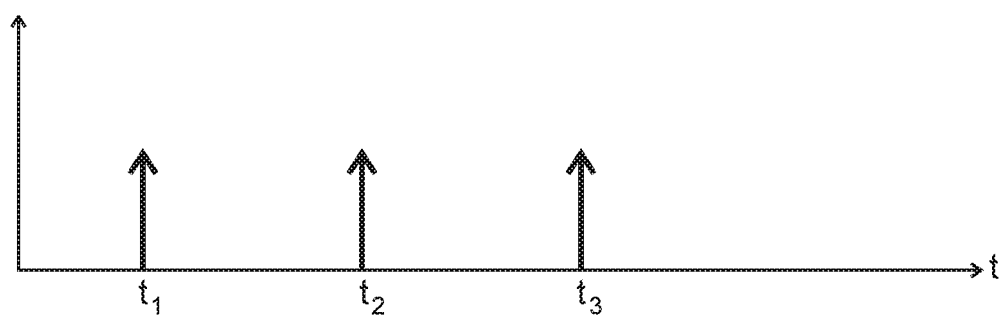
FIG. 2 shows a time chart of a trigger function output by the trigger clock of the test and measurement device shown in FIG. 1.

Generally, the trigger clock 26 is configured to generate repeated trigger clock timings as shown in FIG. 2. These repeated trigger clock timings, representing a trigger function, are forwarded to the acquisition unit 24 for controlling purposes. Thus, the trigger clock 26 controls the acquisition unit 22 by applying the repeated trigger clock timings.

In the shown embodiment, the generation of the trigger clock timings is controlled by the user that interacts with a user interface 30 provided by the display 12. Hence, the user may select a certain frequency for triggering purposes, for instance 50 MHz, wherein this input is processed by the control and processing unit 28 appropriately that controls the trigger clock 26. Thus, the trigger clock 26 is controlled by the control and processing unit 28 such that a non-continuously periodic trigger function is generated which corresponds to the trigger function shown in FIG. 2.

This trigger function consists of trigger clock timings that are equally spaced and periodically. Thus, the trigger clock timings are digital pulses which are forwarded to the acquisition unit 22. The digital pulses generated substantially correspond to Dirac impulses. Hence, the trigger clock 26 is implemented as a digital counter 32 that outputs "0" and "1" in a periodic manner. In other words, the trigger clock 26 corresponds to a switch that issues digital switching events relating to the trigger clock timings. Between the different trigger clock timings, the trigger clock 26 is substantially deactivated while issuing nothing. Therefore, a logic level is established by the trigger clock 26 issuing "0" and "1" corresponding to 2-level logic.

The repeated trigger clock timings generated are used to control the acquisition unit 22 as already mentioned. In detail, the acquisition unit 22, in particular its acquisition memory 24, is controlled such that measurement values are acquired wherein these measurement values correspond to a signal fed to the measurement input 18 of the measurement channel 16.

In some embodiments, the repeated trigger clock timings are used to trigger the readiness of the acquisition unit 22, in particular the trigger memory 24, to start an acquisition provided that the trigger condition of an acquisition trigger is met. This means that the repeated trigger clock timings are not used for starting an acquisition as only the readiness for starting an acquisition is triggered appropriately.

However, the repeated trigger clock timings may also be used for triggering the acquisition such that measurement values are acquired in a periodic manner corresponding to the frequency set.

According to another embodiment, the repeated trigger clock timings may be used to trigger a post-processing of an already acquired signal that is (temporarily) stored in the acquisition memory. This post-processing may relate to a visualization of the measurement data obtained and stored.

Furthermore, a delay unit 34 is provided that is configured to shift the trigger clock timings by at least one time delay. In the shown embodiment, the delay unit 34 is established by a portion of the control and processing unit 28. However, the delay unit 34 can be implemented by the trigger clock 26 itself. In addition, the delay unit 34 may be provided by a separately formed unit within the test and measurement device 10.

The delay unit 34 is configured to adjust the time interval between two subsequent trigger clock timings by the time delay. The time delay may be between 0 and the time interval between two subsequent trigger clock timings such that the delay unit 34 only delays the output of one trigger clock timing without cancelling the trigger clock timing. Hence, issuing a trigger clock timing can be postponed appropriately.

In the shown embodiment, the test and measurement device 10 is an oscilloscope 36. However, the test and measurement device 10 can also be implemented by a spectrum analyzer having a trigger function.

As the test and measurement device 10 may comprise several measurement channels 16, it is ensured that each of these several measurement channels 16 can be used for measurement purposes as no external signal generator has to be connected to one of the several measurement channels 18 for providing a trigger signal. Moreover, an internal signal generator is not required that generates a trigger signal since the trigger function provided by singular events is sufficient for triggering the acquisition unit 22 in an appropriate manner.

Therefore, a signal line between an internal signal generator (if provided) and the acquisition unit 22 or the trigger clock 26 is not required for triggering purposes.

Even though the trigger clock 26 is controlled by the user, in particular via an input on the interface 30 displayed, the trigger clock 26 may also be controlled by a signal generator (internal or external). Therefore, the signal generated by the signal generator is processed such that the singular events of the trigger clock timings are outputted in dependency of the signal generator. However, the signal generated by the signal generator is not used as a triggering signal, but as a control signal for controlling the trigger clock 26 appropriately to issue the trigger clock timings in a controlled manner as defined by the signal generator.

Accordingly, irrespective of the different embodiments, trigger clock timings (relating to a non-continuous, but periodic trigger function) are issued for triggering the acquisition unit in an appropriate manner. Hence, no continuous trigger signal is generated and used for triggering purposes such as a rectangular signal or a sinusoidal signal.

Therefore, a cost-efficient test and measurement device 10 and a method are provided that can be used for triggering and measuring purposes without limiting the versatility of the test and measurement device 10.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and measurement device comprising:
   at least one measurement channel;
   a measurement input;
   an analog to digital converter;

an acquisition unit comprising an acquisition memory that stores data processed by an acquisition trigger located upstream of the acquisition memory;

a trigger clock connected to the acquisition unit via only one unidirectional signal line, wherein the trigger clock is configured to trigger the readiness of the acquisition unit to start an acquisition provided that a trigger condition of the acquisition trigger is met, wherein the trigger clock is configured to generate repeated trigger clock timings, said trigger clock timings being singular events that control said acquisition unit, wherein the repeated trigger clock timings are used to trigger the readiness of the acquisition unit to start the acquisition provided that the trigger condition of the acquisition trigger is met; and a user interface being connected to said trigger clock, wherein said trigger clock is configured to be set via said user interface such that the user sets the trigger clock via the user interface before the repeated trigger clock timings are generated, and wherein the user interface is configured to allow the user to set a frequency, wherein the trigger clock is capable of outputting the trigger clock timings spaced from each other by a time interval corresponding to the frequency set by the user.

2. The test and measurement device according to claim 1, wherein said repeated trigger clock timings are established by a logic level.

3. The test and measurement device according to claim 1, wherein said trigger clock timings control said acquisition memory such that a post-processing of an acquired signal is controlled by said repeated trigger clock timings.

4. The test and measurement device according to claim 1, wherein said acquisition unit is controlled such that measurement values are acquired, said measurement values corresponding to a signal fed to said measurement input of said measurement channel.

5. The test and measurement device according to claim 1, wherein said repeated trigger clock timings are equally spaced.

6. The test and measurement device according to claim 1, wherein said repeated trigger clock timings are periodical.

7. The test and measurement device according to claim 1, wherein said repeated trigger clock timings are spaced according to a predetermined sequence.

8. The test and measurement device according to claim 1, wherein said trigger clock is implemented as a digital counter.

9. The test and measurement device according to claim 1, wherein a delay unit is provided, said delay unit being configured to shift said trigger clock timings by at least one time delay.

10. The test and measurement device according to claim 9, wherein said at least one time delay is between 0 and the time interval between two subsequent trigger clock timings.

11. The test and measurement device according to claim 1, wherein said test and measurement device is an oscilloscope or a spectrum analyzer.

12. The test and measurement device according to claim 1, wherein the repeated trigger clock timings are not used for starting or stopping an acquisition.

13. The test and measurement device according to claim 1, wherein the repeated trigger clock timings trigger said acquisition unit by controlling the acquisition of measurement values corresponding to a signal fed to said measurement input of said measurement channel.

14. The test and measurement device according to claim 1, wherein the trigger clock is connected with a control and processing unit, and wherein the control and processing unit is configured to control the trigger clock based on an input of the user via the user interface.

15. A test and measurement device comprising:
at least one measurement channel;
a measurement input;
an analog to digital converter;
an acquisition unit;
a trigger clock connected to the acquisition unit via only one unidirectional signal line, wherein the trigger clock is configured to trigger the readiness of the acquisition unit to start an acquisition provided that a trigger condition of an acquisition trigger is met, wherein the trigger clock is configured to generate repeated trigger clock timings, said trigger clock timings being singular events that control said acquisition unit, wherein the repeated trigger clock timings are used to trigger the readiness of the acquisition unit to start the acquisition provided that the trigger condition of the acquisition trigger is met; and
wherein the trigger clock is capable of outputting the trigger clock timings spaced from each other by a time interval corresponding to a frequency that corresponds to a supply frequency in order to recognize if interference between a measuring signal and a supply current occurs as the measuring signal is constant provided that the interference is caused by the supply frequency.

16. A test and measurement device comprising:
at least one measurement channel;
a measurement input;
an analog to digital converter;
an acquisition unit comprising an acquisition memory and an acquisition trigger;
a trigger clock connected to the acquisition unit via only a single unidirectional signal line, wherein the trigger clock is configured to control the acquisition unit by triggering the readiness of the acquisition unit to start an acquisition of data processed by the acquisition trigger located upstream of the acquisition memory, wherein the data is stored in the acquisition memory when a trigger condition of the acquisition trigger is met,
wherein the trigger clock is configured to generate repeated trigger clock timings, said trigger clock timings being singular events that control said acquisition unit, wherein the repeated trigger clock timings are used to trigger the readiness of the acquisition unit to start the acquisition provided that the trigger condition of the acquisition trigger is met such that the repeated trigger clock timings are not used for starting or stopping the acquisition; and
a user interface being connected to said trigger clock,
wherein said trigger clock is configured to be set via said user interface such that the user sets the trigger clock via the user interface before the repeated trigger clock timings are generated, and
wherein the user interface is configured to allow the user to set a frequency, wherein the trigger clock is capable of outputting the trigger clock timings spaced from each other by a time interval corresponding to the frequency set by the user.

* * * * *